United States Patent [19]

Tane

[11] Patent Number: 5,442,241
[45] Date of Patent: Aug. 15, 1995

[54] BUMP ELECTRODE STRUCTURE TO BE COUPLED TO LEAD WIRE IN SEMICONDUCTOR DEVICE

[75] Inventor: Yasuo Tane, Urayasu, Japan

[73] Assignee: Kabushiki Kaisha Toshiba, Kawasaki, Japan

[21] Appl. No.: 278,759

[22] Filed: Jul. 22, 1994

[30] Foreign Application Priority Data

Jul. 26, 1993 [JP] Japan .................. 5-183879

[51] Int. Cl.6 ............. H01L 23/48; H01L 29/44; H01L 29/52; H01L 29/60
[52] U.S. Cl. ................... 257/784; 257/781
[58] Field of Search .............. 257/786, 784, 737, 738, 257/779, 780, 781, 673, 666, 774, 775, 773, 776

[56] References Cited

U.S. PATENT DOCUMENTS 3,462,349 8/1969 Gorgenyi ................ 257/781
4,742,023 5/1988 Hasegawa ............... 257/781
5,136,363 8/1992 Endo et al. .............. 257/781
5,194,931 3/1993 Araki .................... 257/784

FOREIGN PATENT DOCUMENTS 57-133651 8/1982 Japan ..................... 257/737
3116744 5/1991 Japan ..................... 257/784

Primary Examiner—Sara W. Crane
Assistant Examiner—Jhihan Clark
Attorney, Agent, or Firm—Finnegan, Henderson, Farabow, Garrett & Dunner

[57] ABSTRACT

A semiconductor device comprising a semiconductor substrate having an insulating film thereon, a pad electrode provided on the insulating film, first and second bumps disposed on the pad electrode to provide a gap therebetween, and a lead wire coupled to the gap. In the structure, each of the first and second bumps has a straight or mushroom bump structure.

6 Claims, 1 Drawing Sheet

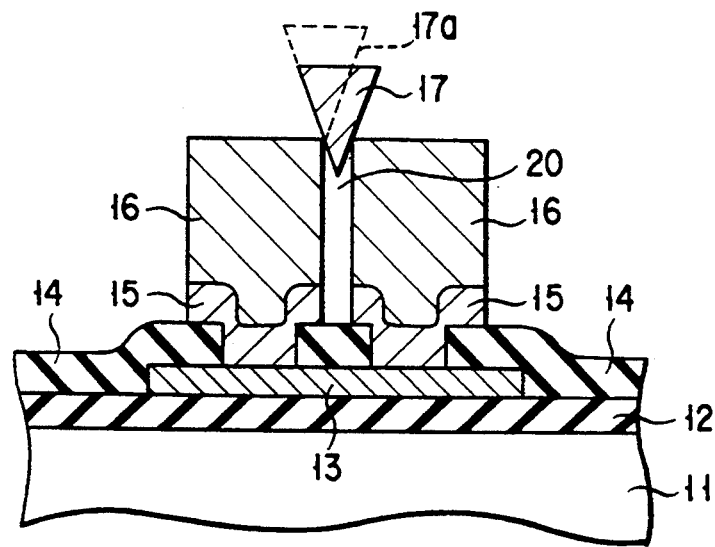
F I G. 1
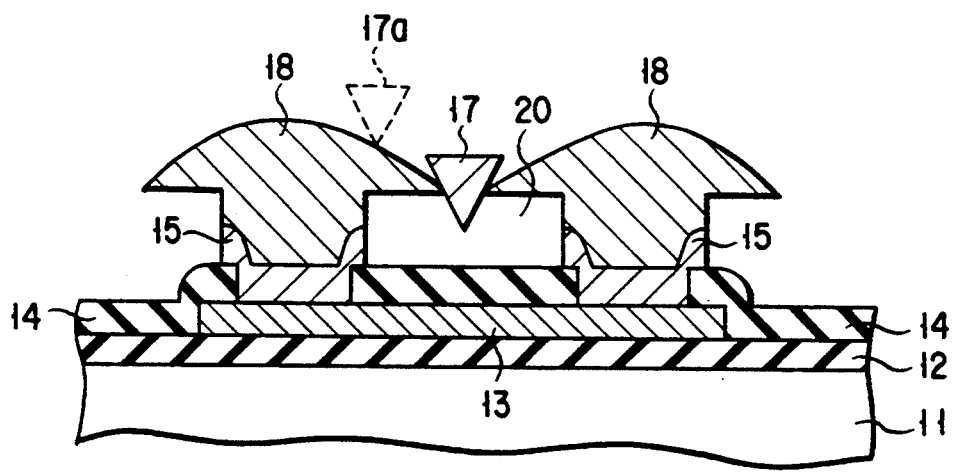
F I G. 2

BUMP ELECTRODE STRUCTURE TO BE COUPLED TO LEAD WIRE IN SEMICONDUCTOR DEVICE

BACKGROUND OF THE INVENTION

1. Field of the Invention

This invention relates to a semiconductor device having a TAB (Tape Automated Bonding) tape, and more particularly to connection between electrode pads and leads.

2. Description of the Related Art

There is a TCP (Tape Carrier Package) developed in accordance with the development of semiconductor device packages each having many pins. A TAB tape to be used in the TCP consists of a polyimide film and leads formed on the polymide film. The leads are formed by etching a copper film adhered to the polyimide film by an adhesive. The leads are connected to pads formed on a semiconductor chip through bumps.

A pad pitch has recently been fine, and accordingly the cross section of a lead has been changed from a trapezoid to a triangle. This is because a fine pad pitch means a fine lead width and lead pitch. As a result, it is very difficult to etch the copper film, the leads are formed to have a wedge-shaped cross section.

When the lead is connected to the pad by a single point bonding method, the wedge-shaped lead will easily be slipped from a bump provided on the pad. This makes it difficult to reliably bond the lead to the pad, and also may cause shortcircuiting of the leads. If the lead is thinner to prevent it from having a wedge-shaped cross section, the bonding strength in the case of ILB (Inner Lead Bonding) or OLB (Outer Lead Bonding) is reduced. Therefore, it is not desirable to thin the thickness of lead. The same can be said of a gang bonding method.

SUMMARY OF THE INVENTION

It is an object of the present invention to provide a semiconductor device having a bump structure suitable to the case of bonding wedge-shaped leads.

According to one aspect of the present invention, there is provided a semiconductor device comprising a semiconductor substrate having an insulating film thereon, a pad electrode provided on the insulating film, first and second bumps disposed on the pad electrode to provide a gap therebetween, and a lead wire coupled to the gap. Each of the first and second has a straight or mushroom bump structure.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a schematic cross sectional view, showing a first embodiment of the invention; and FIG. 2 is a schematic cross sectional view, showing a second embodiment of the invention.

DETAILED DESCRIPTION OF THE PREFERRED EMBODIMENTS

The first embodiment of the invention will be explained with reference to FIG. 1.

The semiconductor device comprises a pad 13 provided on an insulating film 12 on a semiconductor substrate 11, a passivation film 14 formed on the surface except for two exposed portions of the pad 13, a barrier metal layer 15 formed on each of the exposed portions, a straight bump 16 formed on each of the barrier metal layers 15, and a lead 17 having a wedge-shaped structure bonded between the straight bumps 16.

The two straight bumps 16 are disposed on the pad 13 to provide a gap 20 therebetween. The gap 20 is located at the center of the pad 13. The lead 17 is bonded to the straight bumps 16 such that its tip is wedged into the gap 20. In a bonding process, even if a lead is placed at a position of a lead 17a shown by the broken line, the lead 17's tip slips into the gap 20, and the lead 17a is shifted to a predetermined position, in a word, a position of the lead 17.

It is easy to form the two straight bumps 16 on the single pad 13, and the lead 17 can be bonded between them. Further, this structure enables the lead 17 to have a thickness of 35 $\mu$m when the pad pitch is 60 $\mu$m, thus keeping a sufficient bonding strength.

The second embodiment of the invention will be explained with reference to FIG. 2, centering on the things that differ from the first embodiment. In the second embodiment, two mushroom bumps 18 are formed on a pad 13, and a lead 17 is wedged between the mushroom bumps 18. Since each of the mushroom bumps 18 inclines toward a gap 20, even if a lead is placed in a position of a lead 17a indicated by the broken line, it slides along the inclined surface of the mushroom bump 18 and is placed in a position of the lead 17.

Although in the above-described embodiments, two bumps are formed on a single pad, more bumps may be formed thereon, if necessary.

In accordance with a reduction in pad pitch, each lead of a TAB tape is formed a wedge-shaped structure. According to the bump structure of the invention, the wedge-shaped lead can be bonded in a reliable manner. As a result, it is not necessary to thin the thickness of the lead in order to make it have a trapezoid cross section, thereby enhancing the bonding strength in the case of the ILB or the OLB. Further, the bump structure has an effect of correcting the position of each lead, facilitating fine bonding.

It is further understood by those skilled in the art that the foregoing description is only of the preferred embodiments and that various changes and modifications may be made in the invention without departing from the spirit and scope thereof.

What is claimed is:

1. A semiconductor device comprising:
    a semiconductor substrate having a main surface with an insulating film thereon;
    a pad electrode provided on the insulating film;
    first and second bumps disposed on the pad electrode to provide a gap therebetween; and
    a lead wire provided along the gap and parallel with the main surface of the substrate, the lead wire direction perpendicular to and upward from the main surface, at least a portion of the lead wire secured in the gap to couple the first and second bumps.

2. The semiconductor device according to claim 1, wherein each of said first and second bumps has a straight bump structure.

3. The semiconductor device according to claim 1, wherein each of said first and second bumps has a mushroom bump structure.

4. The semiconductor device according to claim 1, wherein a barrier metal layer is provided between each of said first and second bumps and said pad electrode.

5. The semiconductor device according to claim 1, wherein the cross section of the lead wire is wedge-shaped.

6. The semiconductor device according to claim 1, wherein the lead wire is a tape automated bonding lead wire.

* * * * *